(12) United States Patent
Chang et al.

(10) Patent No.: US 10,396,204 B2
(45) Date of Patent: Aug. 27, 2019

(54) SEMICONDUCTOR DEVICE AND METHOD FOR FABRICATING THE SAME

(71) Applicant: UNITED MICROELECTRONICS CORP., Hsin-Chu (TW)

(72) Inventors: Che-Wei Chang, Taoyuan (TW); Chun-Hsiung Wang, Kaohsiung (TW); Chih-Wei Chen, Taichung (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/700,193

(22) Filed: Sep. 11, 2017

(65) Prior Publication Data

US 2018/0076327 A1 Mar. 15, 2018

Related U.S. Application Data

(63) Continuation of application No. 15/344,602, filed on Nov. 7, 2016, now Pat. No. 9,837,541.

(30) Foreign Application Priority Data

Sep. 13, 2016 (TW) .............................. 105129704 A

(51) Int. Cl.
*H01L 29/78* (2006.01)
*H01L 29/06* (2006.01)
*H01L 29/66* (2006.01)

(52) U.S. Cl.
CPC ...... *H01L 29/7851* (2013.01); *H01L 29/0653* (2013.01); *H01L 29/66681* (2013.01); *H01L 29/66795* (2013.01); *H01L 29/785* (2013.01); *H01L 29/7816* (2013.01)

(58) Field of Classification Search
CPC ........... H01L 29/7851; H01L 29/66795; H01L 29/0653; H01L 29/66681; H01L 29/7816
See application file for complete search history.

(56) References Cited

U.S. PATENT DOCUMENTS

| | | | |
|---|---|---|---|
| 8,741,776 B2 | 6/2014 | De et al. | |
| 9,041,127 B2 | 5/2015 | Campi, Jr. et al. | |
| 2013/0062692 A1 | 3/2013 | Chen et al. | |
| 2015/0357462 A1 | 12/2015 | Ponoth et al. | |
| 2016/0181358 A1* | 6/2016 | Zhang | H01L 29/66689 257/339 |
| 2016/0380095 A1 | 12/2016 | Logan | |

* cited by examiner

*Primary Examiner* — Karen Kusumakar
(74) *Attorney, Agent, or Firm* — Winston Hsu

(57) ABSTRACT

A semiconductor device includes: a gate structure extending along a first direction on a substrate, in which the gate structure includes a first edge and a second edge extending along the first direction; a first doped region adjacent to one side of the gate structure, in which the first doped region includes a third edge and a fourth edge extending along the first direction; a second doped region adjacent to another side of the gate structure, in which the second doped region comprises a fifth edge and a sixth edge extending along the first direction; a first fin-shaped structure extending from the second edge of the gate structure toward the third edge of the first doped region; and a second fin-shaped structure extending from the first edge of the gate structure toward the sixth edge of the second doped region.

10 Claims, 4 Drawing Sheets

SEMICONDUCTOR DEVICE AND METHOD FOR FABRICATING THE SAME

CROSS REFERENCE TO RELATED APPLICATIONS

This is a continuation application of U.S. patent application Ser. No. 15/344,602, filed on Nov. 7, 2016, and all benefits of such earlier application are hereby claimed for this new continuation application.

BACKGROUND OF THE INVENTION

1. Field of the Invention

The invention relates to a semiconductor device, and more particularly to a semiconductor device having a number of the fin-shaped structures adjacent to one side of the gate structure different from a number of the fin-shaped structures adjacent to another side of the gate structure.

2. Description of the Prior Art

Having the advantages of a high operational bandwidth, a high operational efficiency, and a planar structure that eases the integration in other integrated circuits, lateral double-diffused metal-oxide-semiconductor (LDMOS) transistor devices are widely used in high operational voltage environments such as CPU power supplies, power management systems, AC/DC converters, and high-power or high frequency (HF) band power amplifiers.

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

However, the integration of fin-shaped structure and LDMOS in current fabrication still resides numerous bottlenecks which induces current leakage of the device and affects overall performance of the device. Hence, how to improve the current FinFET fabrication and structure has become an important task in this field.

SUMMARY OF THE INVENTION

According to a preferred embodiment of the present invention, a semiconductor device includes: a gate structure on a substrate and fin-shaped structures adjacent to two sides of the gate structure. Preferably, a number of the fin-shaped structures adjacent to one side of the gate structure is different from a number of the fin-shaped structures adjacent to another side of the gate structure.

According to another aspect of the present invention, a semiconductor device includes: a gate structure extending along a first direction on a substrate, in which the gate structure includes a first edge and a second edge extending along the first direction; a first doped region adjacent to one side of the gate structure, in which the first doped region includes a third edge and a fourth edge extending along the first direction; a second doped region adjacent to another side of the gate structure, in which the second doped region comprises a fifth edge and a sixth edge extending along the first direction; a first fin-shaped structure extending from the second edge of the gate structure toward the third edge of the first doped region; and a second fin-shaped structure extending from the first edge of the gate structure toward the sixth edge of the second doped region.

According to yet another aspect of the present invention, a semiconductor device includes: a gate structure on a substrate; a first doped region adjacent to one side of the gate structure; a second doped region adjacent to another side of the gate structure; and fin-shaped structures on the substrate. Preferably, a number of the fin-shaped structures covered by the gate structure is different from a number of the fin-shaped structures overlapping the first doped region or the second doped region.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
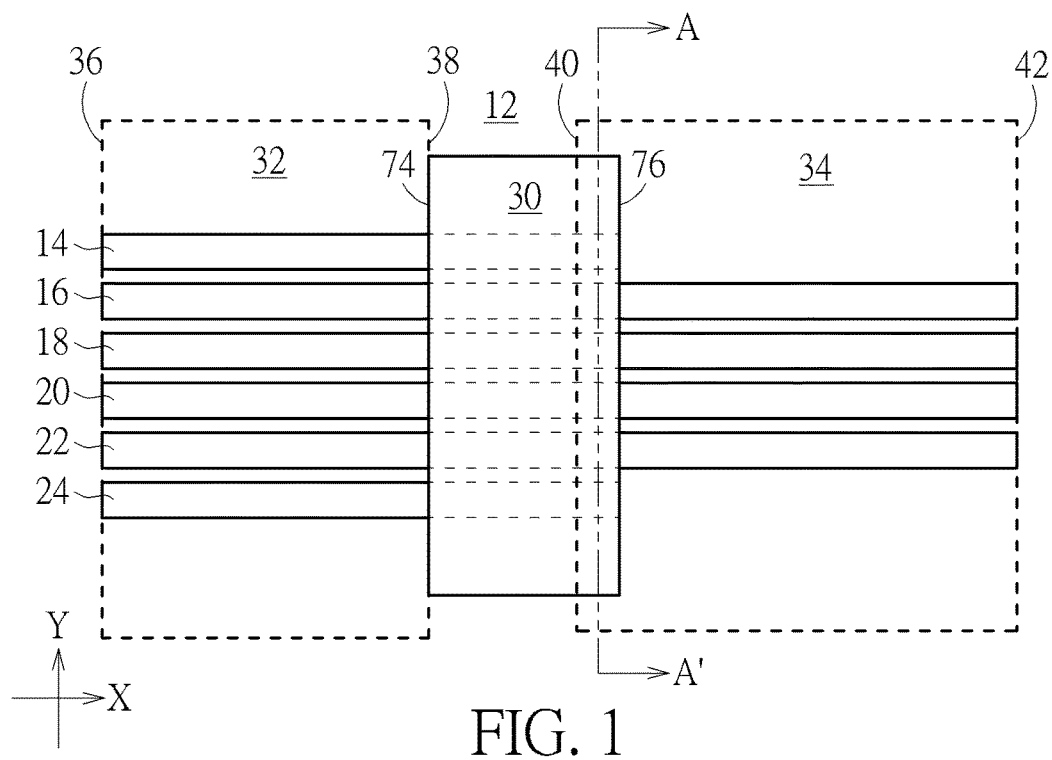
FIG. 1 illustrates a top view for fabricating a LDMOS device according to a preferred embodiment of the present invention.
Figure 2:
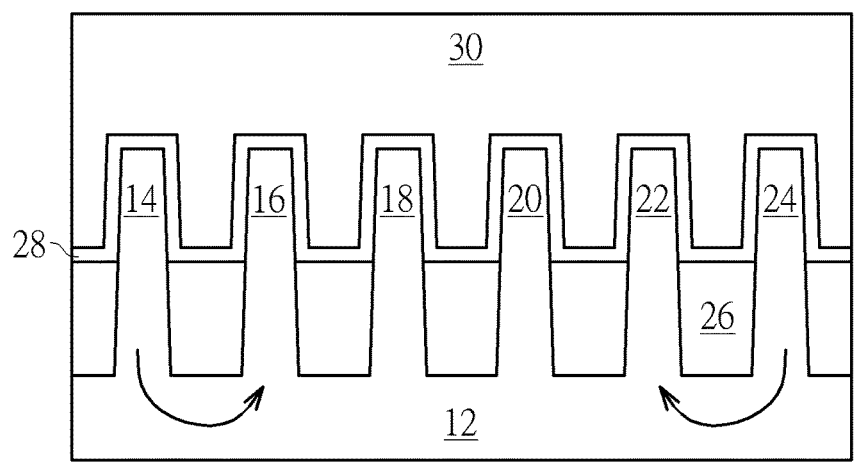
FIG. 2 illustrates a cross-section view of FIG. 1 along the sectional line AA'.

Referring to FIGS. 1-2, FIG. 1 illustrates a top view for fabricating a LDMOS device according to a preferred embodiment of the present invention and FIG. 2 illustrates a cross-section view of FIG. 1 along the sectional line AA'. As shown in FIGS. 1-2, the LDMOS device preferably includes a substrate 12, a plurality of fin-shaped structures 14, 16, 18, 20, 22, 24 on the substrate 12, a shallow trench isolation (STI) 26 surrounding the fin-shaped structures 14, 16, 18, 20, 22, 24, a gate dielectric layer 28 on the STI 26 and fin-shaped structures 14, 16, 18, 20, 22, 24, a gate structure 30 on the gate dielectric layer 28 and the fin-shaped structures 14, 16, 18, 20, 22, 24, a first doped region 32 adjacent to one side of the gate structure 30, and a second doped region 34 adjacent to another side of the gate structure 30.

According to an embodiment of the present invention, the fin-shaped structure 14, 16, 18, 20, 22, 24 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred to the substrate underneath, and through additional fin cut processes, desirable pattern structures, such as stripe patterned fin-shaped structures could be obtained.

Alternatively, the fin-shaped structure 14, 16, 18, 20, 22, 24 could also be obtained by first forming a patterned mask (not shown) on the substrate 12, and through an etching process, the pattern of the patterned mask is transferred to the substrate 12 to form the fin-shaped structure 14, 16, 18, 20, 22, 24. Moreover, the formation of the fin-shaped structure 14, 16, 18, 20, 22, 24 could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure 14, 16, 18, 20, 22, 24. These approaches for forming fin-shaped structures are all within the scope of the present invention.

In this embodiment, the substrate 12 could be a semiconductor substrate such as a silicon substrate, an epitaxial substrate, a SiC substrate, or a silicon-on-insulator (SOI) substrate, but not limited thereto. The gate dielectric layer 28 could include $SiO_2$, SiN, or high-k dielectric material. Spacers (not shown) could be formed around the gate structure 30, and the gate structure 30 could be a polysilicon gate or a metal gate depending on the demand of the product. The first doped region 32 and the second doped region 34 could include n-type dopants or p-type dopants depending on the type of transistor to be fabricated, in which the first doped region 32 in this embodiment is preferably a source region while the second doped region 34 is a drain region, but not limited thereto.

According to an embodiment of the present invention, if the gate structure 30 were to be a metal gate, the metal gate could further include a high-k dielectric layer, a work function metal layer, and a low resistance metal layer. The high-k dielectric layer is preferably selected from dielectric materials having dielectric constant (k value) larger than 4. For instance, the high-k dielectric layer may be selected from hafnium oxide ($HfO_2$), hafnium silicon oxide (HfSiO$_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

The work function metal layer is formed for tuning the work function of the later formed metal gates to be appropriate in an NMOS or a PMOS. For an NMOS transistor, the work function metal layer having a work function ranging between 3.9 eV and 4.3 eV may include titanium aluminide (TiAl), zirconium aluminide (ZrAl), tungsten aluminide (WAl), tantalumaluminide (TaAl), hafniumaluminide (HfAl), or titanium aluminum carbide (TiAlC), but it is not limited thereto. For a PMOS transistor, the work function metal layer having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer and the low resistance metal layer, in which the material of the barrier layer may include titanium (Ti), titanium nitride (TiN), tantalum (Ta) or tantalum nitride (TaN). Furthermore, the material of the low-resistance metal layer may include copper (Cu), aluminum (Al), titanium aluminum (TiAl), cobalt tungsten phosphide (CoWP) or any combination thereof.

As shown in FIG. 1, the gate structure 30 is disposed to extend along a first direction, such as extending along a y-axis, in which the gate structure 30 includes a first edge 74 and a second edge 76 extending along the first direction. The first doped region 32 includes a third edge 36 and a fourth edge 38 also extending along the first direction, and the second doped region 34 includes a fifth edge 40 and a sixth edge 42 extending along the same first direction. Preferably, each of the fin-shaped structures 14, 16, 18, 20, 22, 24 disposed within or overlapping the first doped region 32 is used as a source for the LDMOS device, the fin-shaped structures 14, 16, 18, 20, 22, 24 disposed within the second doped region 34 are used as a drain for the LDMOS device, and the fin-shaped structures adjacent to sides of the gate structure 30 are non-symmetrical so that the number, length width, and/or heights of the fin-shaped structures 14, 16, 18, 20, 22, 24 within the first doped region 32 are different from the fin-shaped structures 14, 16, 18, 20, 22, 24 in the second doped region 34. Preferably, the total area constituting the fin-shaped structures 14, 16, 18, 20, 22, 24 on the source side of the device should be greater than or equal to the total area constituting the fin-shaped structures 14, 16, 18, 20, 22, 24 on the drain side of the device, or the total number of fin-shaped structures 14, 16, 18, 20, 22, 24 covered by the gate structure 30 (also being the number of fin-shaped structures constituting the channel width) should be greater than or equal to the number of fin-shaped structures constituting the source and/or drain of the device.

In this embodiment, the number of fin-shaped structures 14, 16, 18, 20, 22, 24 adjacent to one side of the gate structure 30 is different from the number of fin-shaped structures 14, 16, 18, 20, 22, 24 adjacent to another side of the gate structure 30, or viewing from another perspective the number of fin-shaped structures 14, 16, 18, 20, 22, 24 covered by the gate structure 30 is different from the number of fin-shaped structures 14, 16, 18, 20, 22, 24 overlapping the first doped region 32 or the second doped region 34.

Specifically, the LDMOS device of this embodiment includes multiple fin-shaped structures, including six fin-shaped structures 14, 16, 18, 20, 22, 24. Preferably, the fin-shaped structures 14 and 24 are disposed to extend from the third edge 36 of the first doped region 32 toward the second doped region 34, including overlapping the fourth edge 38 of the first doped region 32 and the fifth edge 40 of the second doped region 34 but not contacting the sixth edge of the second doped region 34. The fin-shaped structures 16, 18, 20, 22 on the other hand are disposed to extend from the third edge 36 of the first doped region 32 through the gate structure 30 and to the second doped region 34, including overlapping the fourth edge 38 of the first doped region 32 and fifth edge 40 of the second doped region 23 and also contacting the sixth edge 42 of the second doped region 34.

Viewing from another perspective, the fin-shaped structures 14 and 24 share equal lengths, the fin-shaped structures 14 and 24 share same lengths, and the length of each of the fin-shaped structures 14, 24 within the first doped region 32 is different from the length of each of the fin-shaped structures 14, 24 within the second doped region 34. For instance, the distance of each of the fin-shaped structures 14, 24 extending from the fourth edge 38 of first doped region 32 to the third edge 36 is preferably greater than the distance of each of the fin-shaped structures 14, 24 extending from the fifth edge 40 of second doped region 34 to the sixth edge 42. In addition, the fin-shaped structures 16, 18, 20, 22 also share same lengths, however the distance of each of the fin-shaped structures 16, 18, 20, 22 extending from the first edge 74 of gate structure 30 to the third edge 36 is equivalent to the distance of each of the fin-shaped structures 16, 18, 202, 22 extending from the second edge 76 of gate structure 30 to the sixth edge 42.

In other words, if viewing the gate structure 30 as the center, the number of fin-shaped structures 14, 16, 18, 20, 22, 24, on one side of the gate structure 30 is different from the number of fin-shaped structures 14, 16, 18, 20, 22, 24 on the other side of the gate structure 30. For instance, there are six fin-shaped structures 14, 16, 18, 20, 22, 24 overlapping the first doped region 32 on the left side of gate structure 30 while there are only four fin-shaped structures 16, 18, 20, 22 overlapping the second doped region 34 on the right side of the gate structure 30.

It should be noted that the fin-shaped structures adjacent to two sides of the gate structure 30 provides a non-symmetrical design, in which the fin-shaped structures 14, 24 overlapping the first doped region 32 on the left side of gate structure 30 could be used as an extra path for carrier injection without affecting the overall breakdown voltage of the device, and the $I_{on}/I_{off}$ ratio would also be different from the central fin-shaped structure 16, 18, 20, 22. Under this condition, it would be desirable to provide more flexibility for the device by altering the $I_{on}/I_{off}$ ratio and/or ratio between $I_{on}$ and breakdown voltage according to the demand of the product. If viewing from the operation mode, signals are preferably entered from the fin-shaped structure on one side of the gate structure 30, such as entering from the fin-shaped structure 14 within the first doped region 32, passing through the substrate 12 along the arrow as shown in FIG. 2, and then entering a fin-shaped structure on the other side of the gate structure 30, such as entering the fin-shaped structure 16 within the second doped region 34.

Figure 3:
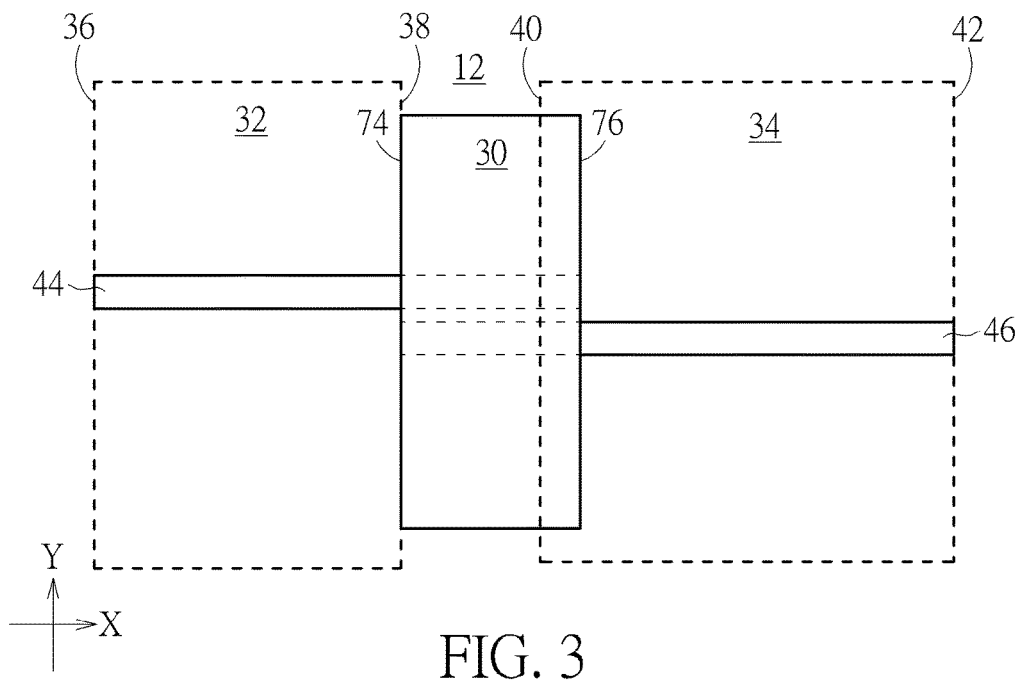
FIG. 3 illustrates a top view of a semiconductor device according to an embodiment of the present invention.

It should be noted that even though a total of six fin-shaped structures are disclosed in this embodiment, the number of the fin-shaped structures could all be adjusted according to the demand of the product. Referring to FIG. 3, FIG. 3 illustrates a top view of a semiconductor device according to an embodiment of the present invention. As shown in FIG. 3, the semiconductor device preferably includes two fin-shaped structures 44, 46, in which the fin-shaped structure 44 is extended from the second edge 76 of the gate structure 30 toward the third edge 36 of the first doped region 32, including overlapping the fourth edge 38 of first doped region 32 and fifth edge 40 of second doped region 34. An end of the fin-shaped structure 44 overlaps the second edge 76 of the gate structure 30. In other words, the fin-shaped structure 44 is only disposed at one side of the gate structure 44. The fin-shaped structure 46 is extended from the first edge 74 of gate structure 30 toward the sixth edge 42 of the second doped region 34, including overlapping the fifth edge 40 of the second doped region 34.

Viewing from another perspective, the distance of fin-shaped structure 44 extending from the fourth edge 38 of first doped region 32 to the third edge 36 is different from the distance of fin-shaped structure 44 extending from the fifth edge 40 of second doped region 34 to the sixth edge 42. For instance, the distance of the fin-shaped structure 44 extending from the fourth edge of first doped region 32 to the third edge 36 is preferably greater than the distance of the fin-shaped structure 44 extending from the fifth edge 40 of second doped region 34 to the sixth edge 42. In other words, the length of the fin-shaped structure 44 within the first doped region 32 is different from the length of fin-shaped structure 44 within the second doped region 34, and similarly the length of the fin-shaped structure 46 within the second doped region 34 is different from the length of fin-shaped structure 46 within the first doped region 32.

In contrast to the number of fin-shaped structures 14, 16, 18, 20, 22, 24 on one side of gate structure 30 is different the number of fin-shaped structures 14, 16, 18, 20, 22, 24 on another side of the gate structure 30, the number of fin-shaped structures 44, 46 adjacent to one side of the gate structure 30 in this embodiment is the same as the number of fin-shaped structures 44, 46 adjacent to another side of the gate structure 30. For instance, one fin-shaped structure 44 is overlapping the first doped region 32 on the left side of gate structure 30 while another fin-shaped structure 46 is overlapping the second doped region 34 on the right side of gate structure 30. The operation mode of this embodiment works similarly as the previously embodiment in that signals preferably enter from the fin-shaped structure 44 adjacent to one side of the gate structure 30, pass the broken region through the substrate 12 underneath, and re-enter the fin-shaped structure 46 on other side of the gate structure 30.

Figure 4:
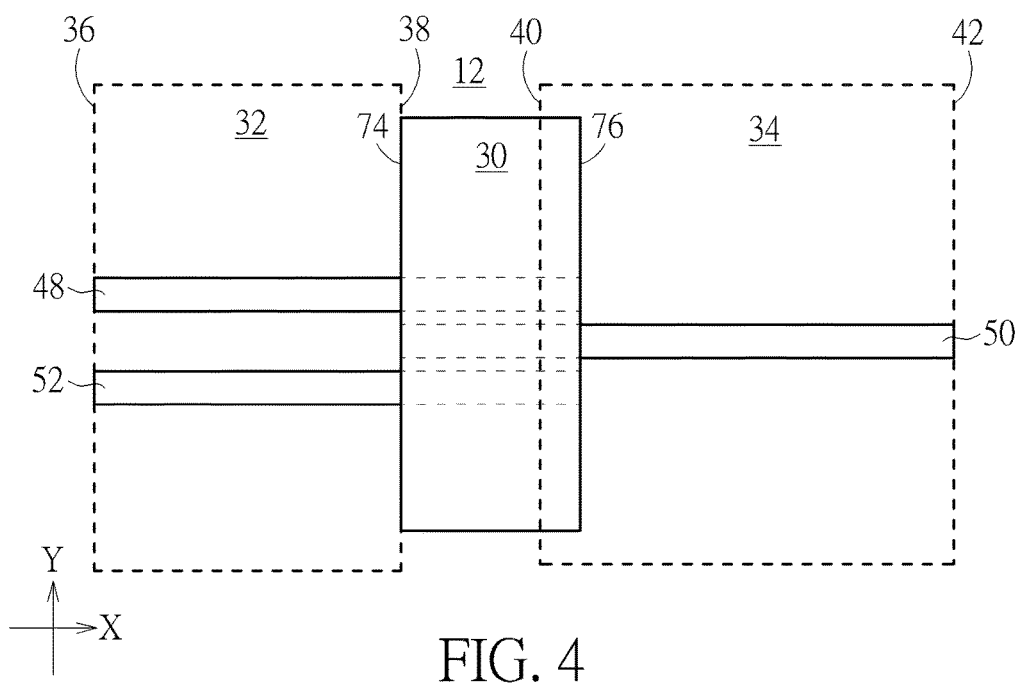
FIG. 4 illustrates a top view of a semiconductor device according to an embodiment of the present invention.

Referring to FIG. 4, FIG. 4 illustrates a top view of a semiconductor device according to an embodiment of the present invention. As shown in FIG. 4, the semiconductor device preferably includes three fin-shaped structures 48, 50, 52, in which the fin-shaped structures 48, 52 are extended from the second edge 76 of the gate structure 30 toward the third edge 36 of the first doped region 32, including overlapping the fourth edge 38 of first doped region 32 and fifth edge 40 of second doped region 34 but not contacting the sixth edge 42 of the second doped region 34. The fin-shaped structure 50 is extended from the first edge 74 of gate structure 30 toward the sixth edge 42 of the second doped region 34, including overlapping the fifth edge 40 of the second doped region 34.

Viewing from another perspective, the fin-shaped structures 48 and 52 preferably share equal lengths, and the distance of each of the fin-shaped structures 48, 52 extending from the fourth edge 38 of first doped region 32 to the third edge 36 is different from the distance of each of the fin-shaped structures 48, 52 extending from the fifth edge 40 of second doped region 34 to the sixth edge 42. For instance, the distance of each of the fin-shaped structures 48, 52 extending from the fourth edge 38 of first doped region 32 to the third edge 36 is greater than the distance of each of the fin-shaped structure 48, 52 extending from the fifth edge 40 of second doped region 34 to the sixth edge 42.

Similar to the embodiment shown in FIG. 1, the number of fin-shaped structures 48, 50, 52 adjacent to one side of the gate structure 30 is different from the number of fin-shaped structures 48, 50, 52 adjacent to another side of the gate structure 30. For instance, two fin-shaped structures 48, 52 are overlapping the first doped region 32 on the left side of gate structure 30 while only a single fin-shaped structure 50 is overlapping the second doped region 34 on the right side of gate structure 30. The operation mode of this embodiment works similarly as the previously embodiment in that signals preferably enter from the fin-shaped structure 48 adjacent to one side of the gate structure 30, pass the broken region through the substrate 12 underneath, and re-enters the fin-shaped structure 50 on other side of the gate structure 30.

Figure 5:
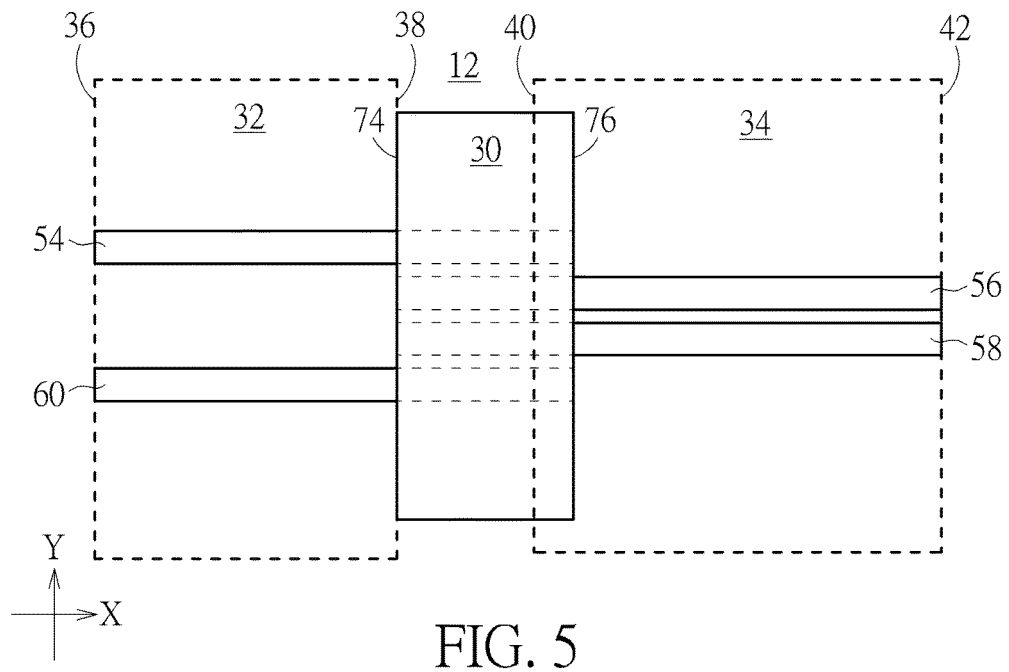
FIG. 5 illustrates a top view of a semiconductor device according to an embodiment of the present invention.

Referring to FIG. 5, FIG. 5 illustrates a top view of a semiconductor device according to an embodiment of the present invention. As shown in FIG. 5, the semiconductor device preferably includes four fin-shaped structures 54, 56, 58, 60, in which the fin-shaped structures 54, 60 are extended from the second edge 76 of the gate structure 30 toward the third edge 36 of the first doped region 32, including overlapping the fourth edge 38 of first doped region 32 and fifth edge 40 of second doped region 34. The fin-shaped structures 56, 58 are extended from the first edge 74 of gate structure 30 toward the sixth edge 42 of the second doped region 34, including overlapping the fifth edge 40 of the second doped region 34.

Viewing from another perspective, the fin-shaped structures 54 and 60 preferably share equal lengths, and the distance of each of the fin-shaped structures 54, 60 extending from the fourth edge 38 of first doped region 32 to the third edge 36 is different from the distance of each of the fin-shaped structures 54, 60 extending from the fifth edge 40 of second doped region 34 to the sixth edge 42. For instance, the distance of each of the fin-shaped structures 54, 60 extending from the fourth edge 38 of first doped region 32 to the third edge 36 is greater than the distance of each of the fin-shaped structure 54, 60 extending from the fifth edge 40 of second doped region 34 to the sixth edge 42.

In contrast to the number of fin-shaped structures 14, 16, 18, 20, 22, 24 on one side of gate structure 30 is different the number of fin-shaped structures 14, 16, 18, 20, 22, 24 on other side of the gate structure 30, the number of fin-shaped structures 54, 56, 58, 60 adjacent to one side of the gate structure 30 in this embodiment is the same as the number of fin-shaped structures 54, 56, 58, 60 adjacent to another side of the gate structure 30. For instance, two fin-shaped structures 54, 60 are overlapping the first doped region 32 on the left side of gate structure 30 while two other fin-shaped structures 56, 58 are overlapping the second doped region 34 on the right side of gate structure 30. The operation mode of this embodiment works similarly as the previously embodiment in that signals preferably enter from the fin-shaped structures 54, 60 adjacent to one side of the gate structure 30, pass the broken region through the substrate 12 underneath, and re-enters the fin-shaped structures 56, 58 on other side of the gate structure 30.

Figure 6:
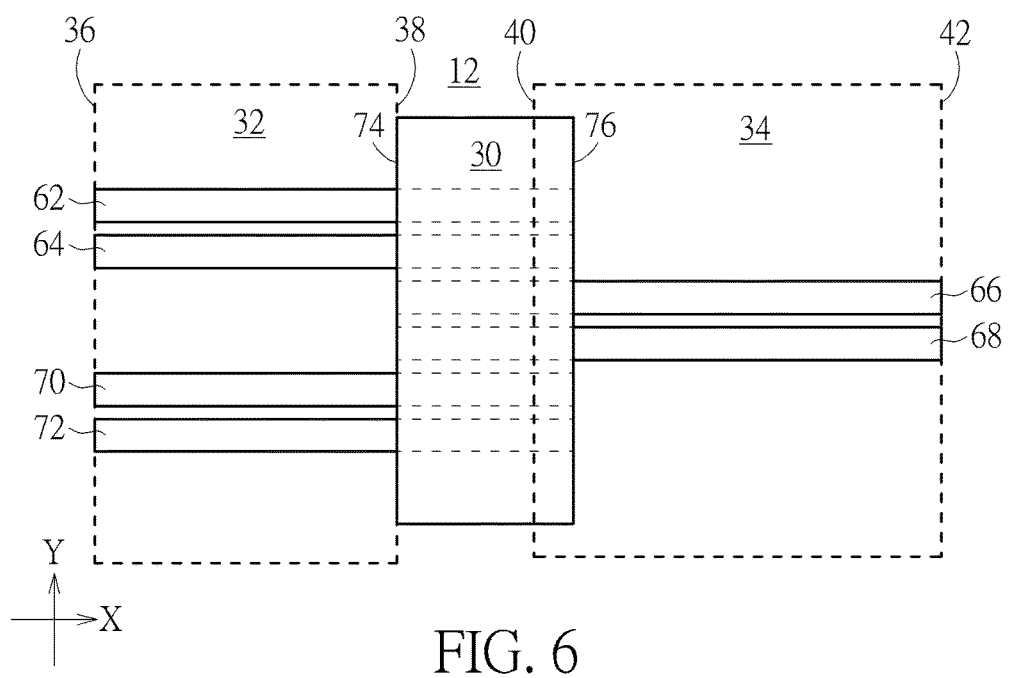
FIG. 6 illustrates a top view of a semiconductor device according to an embodiment of the present invention.

Referring to FIG. 6, FIG. 6 illustrates a top view of a semiconductor device according to an embodiment of the present invention. As shown in FIG. 6, the semiconductor device preferably includes six fin-shaped structures 62, 64, 66, 68, 70, 72, in which the fin-shaped structures 62, 64 and fin-shaped structures 70, 72 are extended from the second edge 76 of the gate structure 30 toward the third edge 36 of the first doped region 32, including overlapping the fourth edge 38 of first doped region 32 and fifth edge 40 of second doped region 34. The fin-shaped structures 66, 68 are extended from the first edge 74 of gate structure 30 toward the sixth edge 42 of the second doped region 34, including overlapping the fifth edge 40 of the second doped region 34.

Viewing from another perspective, the fin-shaped structures 62, 64 and fin-shaped structures 70, 72 preferably share equal lengths, and the distance of each of the fin-shaped structures 62, 64, 70, 72 extending from the fourth edge 38 of first doped region 32 to the third edge 36 is different from the distance of each of the fin-shaped structures 62, 64, 70, 72 extending from the fifth edge 40 of second doped region 34 to the sixth edge 42. For instance, the distance of each of the fin-shaped structures 62, 64, 70, 72 extending from the fourth edge 38 of first doped region 32 to the third edge 36 is greater than the distance of each of the fin-shaped structure 62, 64, 70, 72 extending from the fifth edge 40 of second doped region 34 toward the sixth edge 42.

Similar to the embodiment shown in FIG. 1, the number of fin-shaped structures 62, 64, 66, 68, 70, 72 adjacent to one side of the gate structure 30 is different from the number of fin-shaped structures 62, 64, 66, 68, 70, 72 adjacent to another side of the gate structure 30. For instance, four fin-shaped structures 62, 64, 70, 72 are overlapping the first doped region 32 on the left side of gate structure 30 while two fin-shaped structures 66, 68 are overlapping the second doped region 34 on the right side of gate structure 30. The operation mode of this embodiment works similarly as the previously embodiment in that signals preferably enter from the fin-shaped structures 62, 64, 70, 72 adjacent to one side of the gate structure 30, pass the broken region through the substrate 12 underneath, and re-enter the fin-shaped structures 66, 68 on other side of the gate structure 30.

Figure 7:
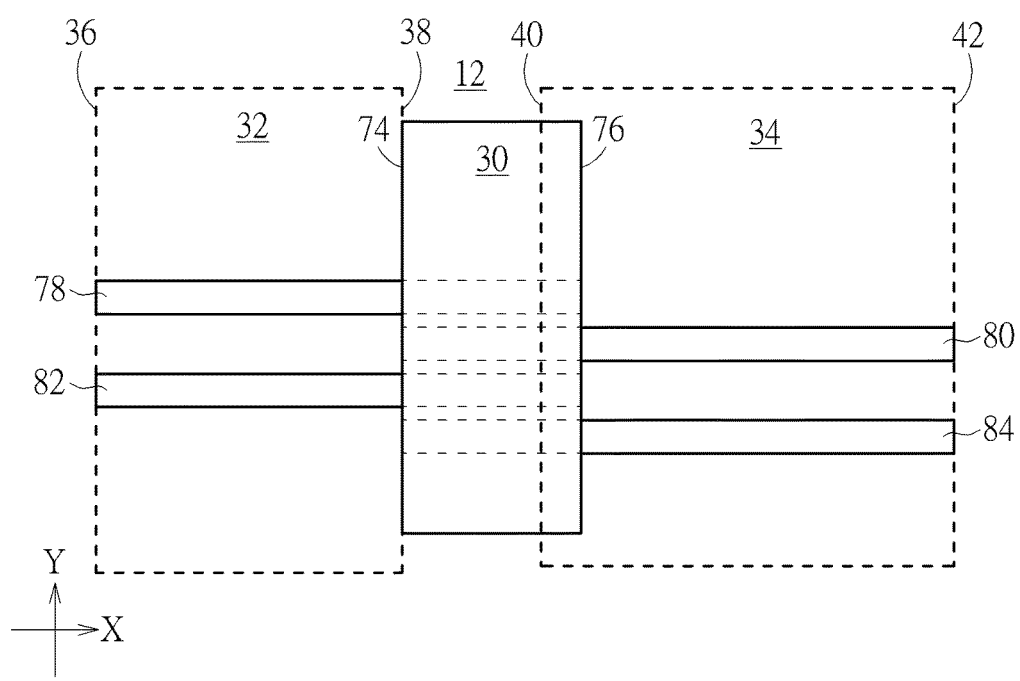
FIG. 7 illustrates a top view of a semiconductor device according to an embodiment of the present invention.

Referring to FIG. 7, FIG. 7 illustrates a top view of a semiconductor device according to an embodiment of the present invention, in which FIG. 7 more specifically reveals a variation of repeating the interchanging design of fin-shaped structures 44, 46 in FIG. 3. As shown in FIG. 7, the semiconductor device preferably includes four fin-shaped structures 78, 80, 82, 84, in which the fin-shaped structures 78, 82 are extended from the second edge 76 of the gate structure 30 toward the third edge 36 of the first doped region 32, including overlapping the fourth edge 38 of first doped region 32 and fifth edge 40 of second doped region 34. The fin-shaped structures 80, 82 are extended from the first edge 74 of gate structure 30 toward the sixth edge 42 of the second doped region 34, including overlapping the fifth edge 40 of the second doped region 34.

Viewing from another perspective, the fin-shaped structures 78 and 82 preferably share equal lengths, and the distance of each of the fin-shaped structures 78, 82 within the first doped region 32 is different from the distance of each of the fin-shaped structures 78, 82 within the second doped region 34. For instance, the length of each of the fin-shaped structures 78, 82 within the second doped region 34 is greater than the length of each of the fin-shaped structures 78, 82 within the first doped region 32.

Overall, the present invention discloses a LDMOS device, in which the fin-shaped structures on one side of the gate structure and the fin-shaped structures on the other side of the gate structure preferably share non-symmetrical design. In this embodiment, the term non-symmetrical could include the fin-shaped structures adjacent to two sides of the gate structure having different number or quantity, same number but different arrangement, or different number and different arrangement. In other words, the number of fin-shaped structures covered by the gate structure could be different from the number of fin-shaped structures overlapped by either the first doped region or the second doped region. By using the aforementioned design, it would be desirable to alter the $I_{on}/I_{off}$ ratio and/or ratio between $I_{on}$ and breakdown voltage according to the demand of the product to provide more operation flexibility for the device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A semiconductor device, comprising:
    a gate structure extending along a first direction on a substrate, wherein the gate structure comprises a first edge and a second edge extending along the first direction;

a first doped region adjacent to a first side of the gate structure, wherein the first doped region comprises a third edge and a fourth edge extending along the first direction;

a second doped region adjacent to a second side of the gate structure, wherein the second doped region comprises a fifth edge and a sixth edge extending along the first direction and the fourth edge and the fifth edge not overlapping each other, and the first side and the second side are opposite to each other;

a first fin-shaped structure extending from the second edge of the gate structure toward and contacting the third edge of the first doped region, wherein the first fin-shaped structure is not disposed at the second side of the gate structure; and a second fin-shaped structure extending from the first edge of the gate structure toward the sixth edge of the second doped region.

2. The semiconductor device of claim 1, wherein the first fin-shaped structure overlaps the fourth edge of the first doped region and the fifth edge of the second doped region.

3. The semiconductor device of claim 1, wherein the second fin-shaped structure overlaps the fifth edge of the second doped region.

4. The semiconductor device of claim 1, further comprising a third fin-shaped structure extending from the second edge of the gate structure toward the third edge of the first doped region.

5. The semiconductor device of claim 4, wherein the third fin-shaped structure overlaps the fourth edge of the first doped region and the fifth edge of the second doped region.

6. The semiconductor device of claim 4, further comprising a fourth fin-shaped structure extending from the first edge of the gate structure toward the sixth edge of the second doped region.

7. The semiconductor device of claim 1, further comprising:

a third fin-shaped structure extending from the first edge of the gate structure toward the sixth edge of the second region; and a fourth fin-shaped structure extending from the second edge of the gate structure toward the third edge of the first doped region.

8. The semiconductor device of claim 7, wherein the third fin-shaped structure overlaps the fifth edge of the second doped region.

9. The semiconductor device of claim 7, wherein the fourth fin-shaped structure overlaps the fourth edge of the first doped region and the fifth edge of the second doped region.

10. A semiconductor device, comprising:

a gate structure extending along a first direction on a substrate, wherein the gate structure comprises a first edge and a second edge extending along the first direction;

a first doped region adjacent to one side of the gate structure, wherein the first doped region comprises a third edge and a fourth edge extending along the first direction;

a second doped region adjacent to another side of the gate structure, wherein the second doped region comprises a fifth edge and a sixth edge extending along the first direction;

a first fin-shaped structure extending from the second edge of the gate structure toward and contacting the third edge of the first doped region, wherein an end of the first fin-shaped structure overlaps the second edge of the gate structure; and a second fin-shaped structure extending from the first edge of the gate structure toward the sixth edge of the second doped region.

* * * * *